United States Patent [19]
Dockrey et al.

[11] Patent Number: 6,087,267
[45] Date of Patent: Jul. 11, 2000

[54] PROCESS FOR FORMING AN INTEGRATED CIRCUIT

[75] Inventors: Jasper W. Dockrey, Austin; Patrick K. Thomas, Pflugerville; Dennis C. Hartman, Austin, all of Tex.

[73] Assignee: Motorola, Inc., Schaumburg, Ill.

[21] Appl. No.: 06/836,048

[22] Filed: Mar. 4, 1986

[51] Int. Cl.⁷ .............................. B44C 1/22; C03C 15/00
[52] U.S. Cl. ........................ 438/719; 438/725; 216/48; 216/55
[58] Field of Search ............................ 204/164, 192 EC, 204/192 E; 156/643, 646, 657, 659.1, 662, 904, 643.1, 646.1, 657.1, 662.1; 252/79.1; 357/23.1, 23.6, 41; 428/446; 430/313, 330, 314; 216/48, 55; 438/719, 725

[56] References Cited

U.S. PATENT DOCUMENTS

| | | | |
|---|---|---|---|
| 4,264,409 | 4/1981 | Forget et al. | 252/79.1 X |
| 4,310,380 | 1/1982 | Flamm et al. | 252/79.1 X |
| 4,380,489 | 4/1983 | Beinvogl et al. | 252/79.1 X |
| 4,426,246 | 1/1984 | Kravitz et al. | 156/657 X |
| 4,433,044 | 2/1984 | Meyer et al. | 156/643 |
| 4,490,209 | 12/1984 | Hartman . | |
| 4,552,831 | 11/1985 | Liu | 156/628 |
| 4,554,048 | 11/1985 | Manocha | 156/643 |
| 4,568,410 | 2/1986 | Thornquist | 156/643 |
| 4,592,132 | 6/1986 | Lee et al. | 29/590 |
| 4,645,562 | 2/1987 | Liao et al. | 156/643 |
| 4,657,845 | 4/1987 | Frechet et al. | 156/643 |

*Primary Examiner*—Edward A. Miller
*Attorney, Agent, or Firm*—George R. Meyer

[57] ABSTRACT

A process for selectively plasma etching polycrystalline silicon or polysilicon in preference to silicon dioxide which minimizes the detrimental effect of carbon. It has been discovered that carbon from the plasma etch chemicals or from photoresist present interferes disadvantageously with the selective plasma etch of polysilicon as opposed to silicon dioxide. By heat treating and deep ultraviolet light treating the photoresist prior to the plasma etch step and by using non-carbon etch chemicals, this detrimental carbon effect can be reduced.

14 Claims, 3 Drawing Sheets

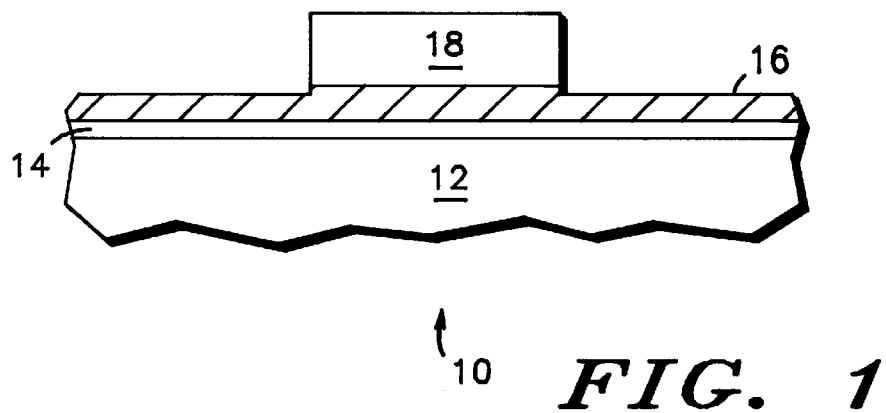
FIG. 1
FIG. 2
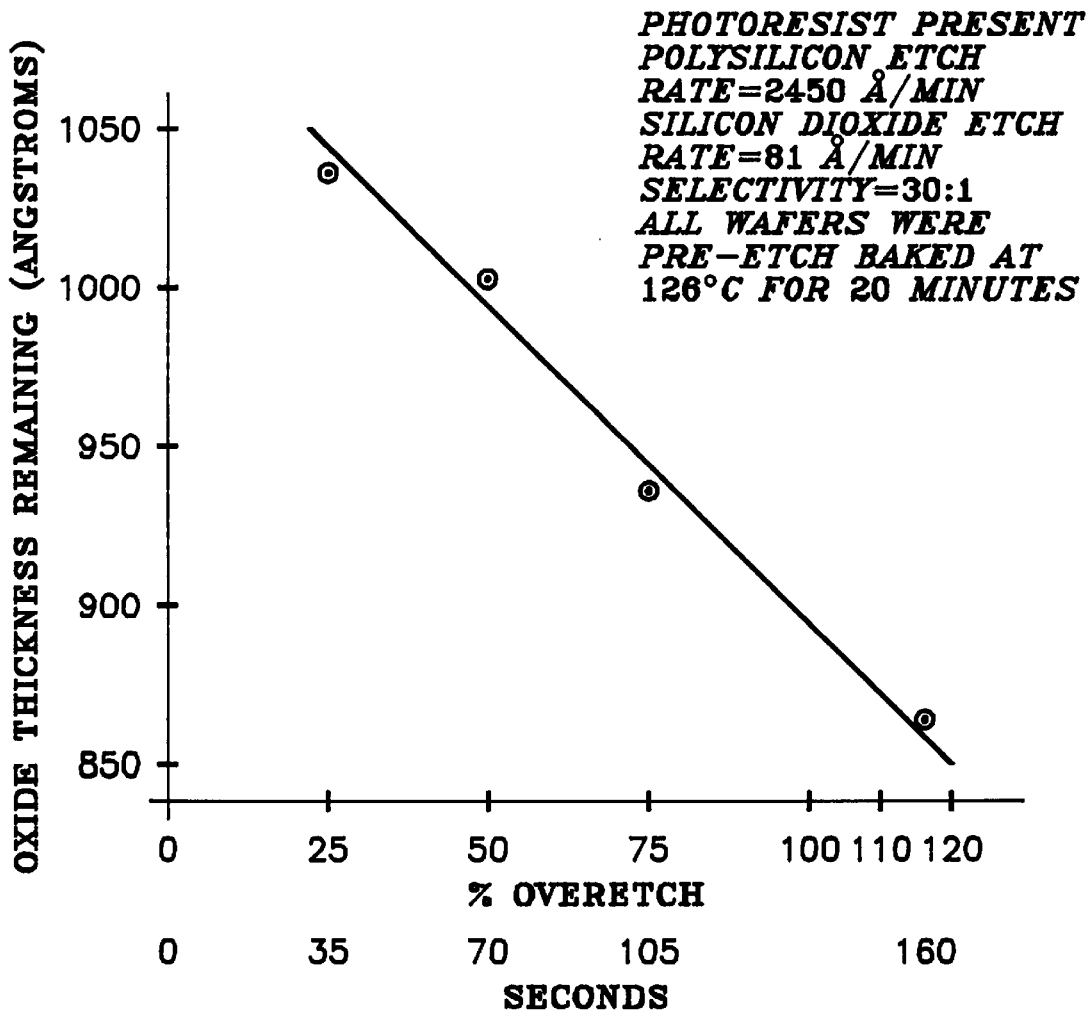

PROCESS FOR FORMING AN INTEGRATED CIRCUIT

FIELD OF THE INVENTION

The invention relates to processes for etching polycrystalline silicon and more particularly relates to selectively plasma etching polysilicon relative to silicon dioxide during the manufacture of an integrated circuit.

BACKGROUND OF THE INVENTION

In the production of very large scale integrated (VLSI) circuits, it is desirable to be able to selectively etch the various layers used in the production of the devices. The term "selectively etch" means simply that the etch process occurs only or primarily upon one of the materials exposed on the working surface of the wafer or that would be exposed once overlying layers were etched through. As a practical matter, it is nearly impossible to develop a series of etch processes which is 100% selective only to a particular material, that is, which will not etch any other material except the one intended. Thus, the goal becomes devising etch processes which will etch the material of interest appreciably faster than the adjacent materials necessarily exposed to the same etch process.

It is typical in the manufacture of VLSI circuits, particularly those made by metal oxide semiconductor (MOS) methods, to form a thin layer of dielectric over the monocrystalline silicon substrate early in the process. Frequently this dielectric material is silicon dioxide or $SiO_2$, which may be deposited or thermally grown. Next it is customary to form the transistor gate electrode material in a layer over the dielectric material layer. Polycrystalline silicon, also called polysilicon, is typically used for this layer. In the etching and forming of the semiconductor devices, the dielectric material layer and the gate material layer are independently formed, usually by etching, into the desired geometries. The preferred way to conduct this selective forming is to use photolithography processes which involve applying a layer of photoresist to the top of the gate material layer, exposing it and washing away the exposed photoresist (in the case of positive photoresist). Then, the portions of the gate material layer which are exposed or open to the ambient on the top surface of the layer are etched. The portions of the gate material layer covered by photoresist are protected and remain. Ideally, only the etching of the gate material layer occurs and the etch process stops or slows greatly when the plasma, if a plasma etch is used, reaches the underlying dielectric layer.

When plasma etch processes are used to etch polysilicon over a silicon dioxide layer alone, the relative etch rates are very good, that is, the etch rate of polysilicon to silicon dioxide is 100 to 1 or better, also expressed as 100:1. However, if photoresist material is present, as it must be if the device geometries are to be formed, the etch rate ratio falls off to 30:1 or less due to an increase in the etch rate of silicon dioxide. Thus, it would be desirable to discover a process for selectively etching polysilicon in preference to $SiO_2$ in the presence of photoresist.

SUMMARY OF THE INVENTION

Accordingly, it is an object of the present invention to provide a plasma etch process for polysilicon in the presence of silicon dioxide that gives a high etch rate of polysilicon relative to the etch rate of silicon dioxide.

Another object of the invention is to provide a selective plasma etch process that affords high etch selectivity of polysilicon to silicon dioxide in the presence of a photoresist mask.

Still another object of the invention is to provide a selective plasma etch process that gives high etch selectivity of polysilicon to silicon dioxide that does not require a treatment technique that is not readily available on most integrated circuit manufacturing lines.

It is another object of the invention to provide a plasma etch process having a high degree of selectivity to polysilicon relative to silicon dioxide which employs readily available plasma etch agents.

In carrying out these and other objects of the invention, there is provided, in one form, a process for the selective plasma etch of an overlying layer relative to an underlying layer on a substrate, which involves first forming an underlying layer on the surface of a substrate, next forming an overlying layer on the underlying layer, and subsequently depositing a layer of photoresist over the overlying layer. Next, a pattern is generated by exposing the photoreist through a photomask and stripping off selected portions of the photoresist. Then the remaining photoresist is exposed to deep ultraviolet light and is baked in a dehydration bake step. The final step involves selectively plasma etching the portions of the overlying layer bared by the mask pattern using a chemical system involving inorganic components.

BRIEF DESCRIPTION OF THE DRAWINGS

FIG. 1 is a cross-sectional illustration of a semiconductor device under construction showing a polysilicon layer on a silicon dioxide layer upon a monocrystalline silicon substrate where the polysilicon is being selectively etched with the aid of a photoresist segment; and FIGS. 2 through 4 are various graphs showing the decrease in oxide thickness over time during various etch procedures including those of the prior art and those of the invention.

DETAILED DESCRIPTION OF THE INVENTION

Figure 3:
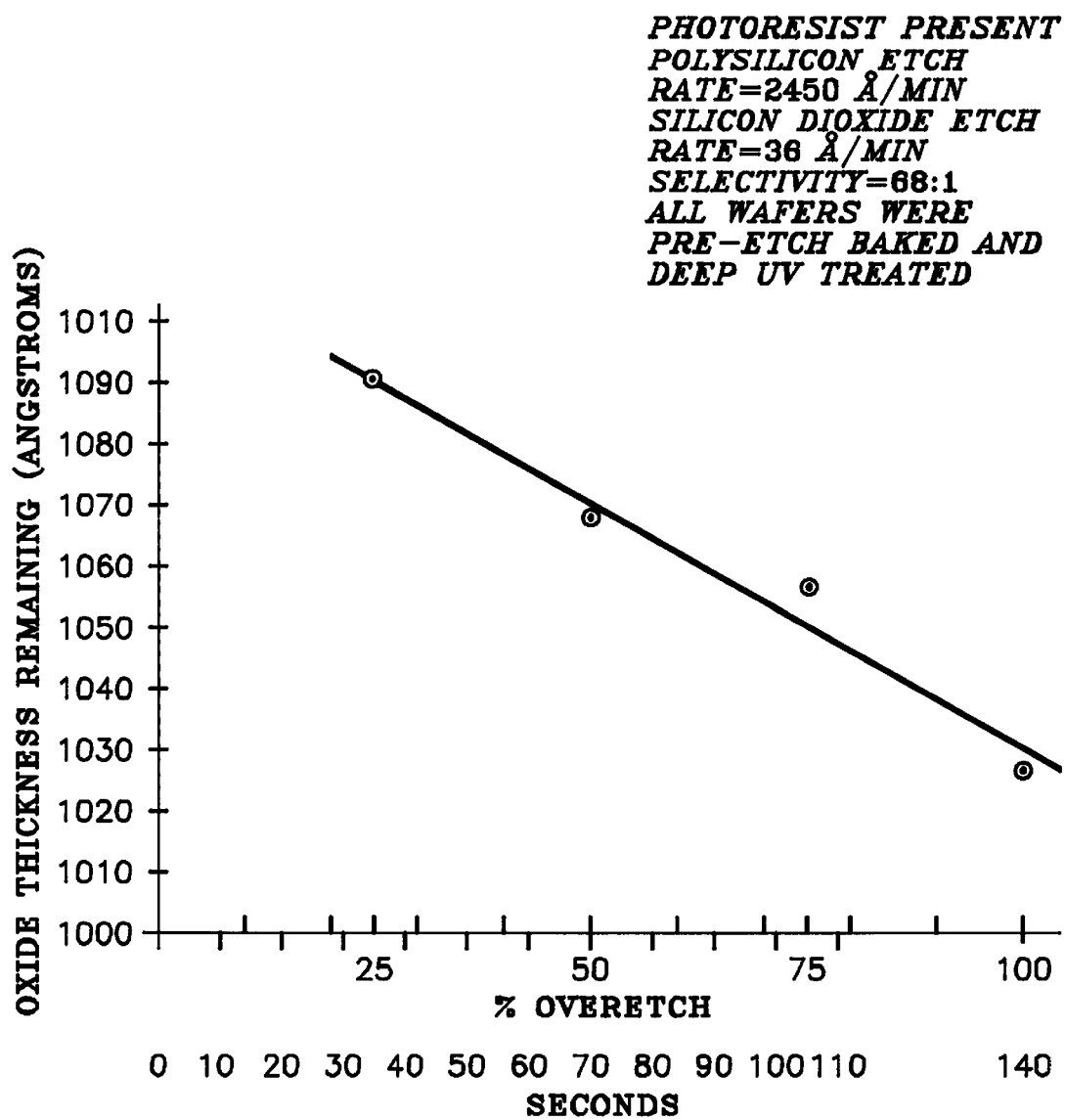

It is expected that the process of the invention will be applicable to a number of etch processes, where it is desired to enhance the selectivity of etch of an overlying layer to an underlying layer. Similarly, the invention may apply to layers placed upon any substrate and the etch is conducted using any of the typical etch procedures, as long as photoresist is present during the etch and chemicals are used in the etch process. However, for the purposes of illustrating the invention only, the process will be described in terms of polycrystalline silicon as the overlying layer, silicon dioxide as the underlying layer, both on a monocrystalline silicon wafer substrate undergoing a plasma selective etch.

Shown in FIG. 1 are the semiconductor components with which this invention is concerned. Semiconductor device 10 under construction is being built upon monocrystalline silicon substrate 12. Thin silicon dioxide layer 14, to be used as the gate dielectric, is formed first and polycrystalline silicon layer 16, to be used as the gate material layer is created next. Photoresist pattern 18 is formed by coating the entire surface of the wafer with a photoresist layer and then exposing selected portions thereof by means of a mask and stripping away the reacted segments, in the case of positive photoresist. It is expected that the method of this invention would be effective on negative photoresists as well, although the invention will be explained in terms of positive photoresist. As shown in FIG. 1, photoresist pattern 18 protects the portions of polysilicon layer 16 that are to remain while the adjacent regions of polysilicon layer 16 are etched away. The goal of the invention is to provide a process which will permit selective etch of polysilicon layer 16 which will cease and not appreciably etch underlying silicon dioxide layer 14.

Due to the surprising discovery noted above that the presence of photoresist 18 lowered the etch rate selectivity of polysilicon layer 16 to silicon dioxide layer 14 from 100:1 to 30:1, the inventors began an attempt to solve the problem. It was discovered that the approach which proved most fruitful was the elimination or reduction of carbon from the plasma etching process. In the description of the invention herein, the term "reduction of carbon" is used to refer to a reduction in the amount of free carbon present or a lowering of the adverse effect of carbon upon the silicon dioxide etch rate.

Carbon is known to react with silicon dioxide to produce elemental silicon. A possible reaction may be expressed as follows:

$$C + SiO_2 \rightarrow CO_2 + Si$$

It is believed that the etching conditions when photoresist is present produce an environment favorable to this reaction.

There were two known sources of carbon in the customary plasma etch process, namely in the photoresist pattern 18 present used to give form and shape to the layer 16 being etched and also in the species used to make up the plasma doing the etching work. Typically, chemicals such as $CF_4$, $CCl_2F_2$, and $CCl_4$ as well as other carbon containing chemicals are used during the polysilicon plasma etch step. Non-carbon or inorganic etching substances are known. For example, hydrogen halides such as hydrogen chloride and hydrogen iodide, nitrogen halides such as nitrogen trifluoride ($NF_3$), sulfur halides such as sulfur hexafluoride ($SF_6$), bimolecular halides such as $Cl_2$ and various combinations thereof have been known to be used, often typically with an inert or noble gas such as helium.

In turn, the carbon present in the photoresist layer 18 on the polysilicon layer 16 must also be dealt with. Carbonless photoresists would be ideal and within the scope of this invention, but such photoresists are not common or readily available. An alternate approach was to see if the carbon within the photoresist could be further bound up so that it could not escape as free carbon during the plasma etch. It was discovered that a deep ultraviolet light exposure for a short period of time and the use of a dehydration bake step would further bind up the carbon in the photoresist. It is suspected that what occurs is that the free carbon or potentially free carbon within the photoresist becomes further crosslinked within the polymer of the photoresist. Thus, the process of this invention involves the simultaneous use of inorganic plasma etch species with carbon-binding photoresist pre-etch treatments.

It is believed that the best temperature for the dehydration bake pretreatment step is about 125° C. or higher. Although the time exposure is not considered critical to the practice of this invention, the dehydration bake step may last from 15 to 30 minutes. The deep ultraviolet light pre-treatment step should use radiation having about 320 nanometers or less. In a particular embodiment, the treatment included deep UV in the range of 100–320 nm. The exposure to deep UV need only be for a short period of time, also not critical to the practice of this invention, typically from 1 to 10 minutes. It will be appreciated that the deep UV light pretreatment is not appreciably different from the typical treatment used to expose the photoresist during prior art methods, which may be taken to be about 436 nm. What is important is that it was unexpectedly discovered that the use of the deep UV exposure together with inorganic plasma etch species enables a highly selective plasma etch process to be performed. Likewise, dehydration bake treatments are also known, for the purposes of dehydration as the name suggests, however, the significance of using a dehydration bake step in conjunction with non-carbon plasma etch systems and inorganic plasma etch species was not realized until now.

The invention will be further illustrated with reference to the following examples which are not intended to limit the invention.

The plasma etching of phosphorus doped polysilicon material on silicon dioxide for all of the Examples herein was carried out in a single wafer plasma etching system. The following physical conditions and chemistry were used in the Examples unless otherwise noted:

| | |
|---|---|
| Power | 400 watts |
| Pressure | 1500 millitorr |
| Temperature | 17° C. |
| Electrode area | 128 cm² |
| Electrode spacing | 1 inch |
| Chemicals | Flow rates (std. cm³/minute) |
| Helium | 295 |
| Hydrogen Chloride | 144 |
| Hydrogen Iodide | 8 |

EXAMPLE 1

This Example was conducted to determine the characteristics of a deglaze etch and a polysilicon etch performed in the absence of photoresist on a series of wafers. A deglaze etch involves the removal of a layer of native oxide from the top of the polysilicon layer, and is considered a "pre-etch" removal step. The starting parameters are noted below. A two-chambered plasma etch reactor was used.

| Deglaze Etch | Chamber 1 |
|---|---|
| Power: | 50 W |
| Pressure: | 300 mtorr |
| Temperature: | 25° C. |
| Gas flows | sccm |
| $CF_4$ | 65 |

| Polysilicon Etch Step | Chamber 2 |
|---|---|
| Power: | 400 W |
| Pressure: | 1500 mtorr |
| Temperature: | 25° C. |
| Gas flows | sccm |
| HCl | 144 |
| He | 304 |
| HI | 8 |

EXAMPLE 2

Shown in FIG. 2 is a graph of remaining silicon dioxide thickness as a function of etch time where the slope of the curve gives the etch rate of the process for Example 2. In this particular experiment, photoresist was present, but only a pre-etch dehydration bake step (126° C. for 20 minutes) was employed as a pretreatment step. The polysilicon etch rate for this example (not plotted) was 2450 angstroms/minute while the silicon dioxide etch rate was 81 angstroms/minute to give an etch selectivity of polysilicon:oxide of 30:1, which is much less than that desired.

EXAMPLE 3

In this Example, a deep UV pretreatment step was conducted using a Mirolite Irradiator-M126P, which gave a deep UV radiation band over the range of 190 to 320 nm, as well as a 125° C. 30 minute dehydration bake in a convection oven before the etch step. The results are shown in FIG. 3. As can be seen from FIG. 3, with the deep UV treatment the selectivity of etch of polysilicon to silicon dioxide is much improved. The polysilicon etch rate was 2450 angstroms/minute and the silicon dioxide etch rate was 36 angstroms/minute to give a selectivity of 68:1.

EXAMPLE 4

Figure 4:
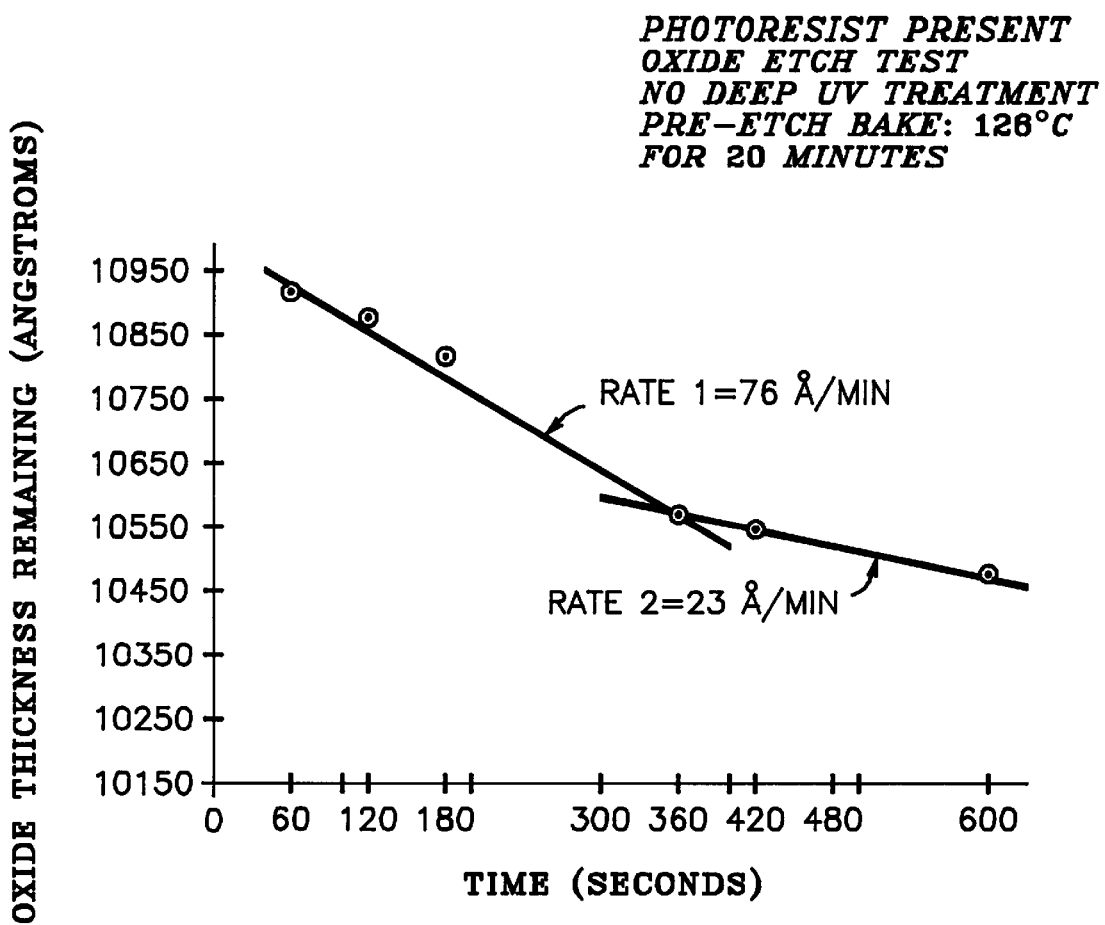

This Example was conducted with polysilicon absent in an attempt to further study the effect of carbon on the etch rate. The photoresist pattern 18 was pre-etch baked at 126° C. for 20 minutes in a convection oven. The photoresist layer 18 thickness was 10,000 angstroms and the oxide layer 14 on which it rested was 10 to 11,000 angstroms thick. The results are plotted on FIG. 4. It may be seen from FIG. 4 that in an oxide etch test with photoresist present and dehydration bake only (no deep UV treatment) that two etch rates may be seen. The change in etch rates at about 360 seconds into the etch process can be attributed to a depletion in the available carbon to perform the side reaction. Thus, the etch rate of the oxide slows down as the available carbon is depleted. This Example thereby demonstrates that the decreased selectivity in the etch rate is, in fact, attributable to the carbon effect.

Notice that without photoresist present that the selectivity in Example 1 is over 100:1. The chemistry thought to occur with polysilicon only should take into account HCl, He and HI as reactants with $SiCl_x$ as presumed products, such as $SiCl_4$. Presumed reactions are:

$$Si + 4HCl \rightarrow SiCl_4 + 2H_2$$

$$Cl + HI \rightarrow HCl + I$$

Chemistry occurring with photoresist and silicon dioxide also present may be expressed as follows:

$$SiO_2 + C \rightarrow CO_2 + Si$$

$$Si + 4HCl \rightarrow SiCl_4 + 2H_2$$

This expresses a carbon induced reduction of $SiO_2$ yielding Si. The following reaction is also possible:

$$4HI + Si \rightarrow SiI_4 + 2H_2$$

A highly selective polysilicon etch process is sought that will provide an anisotropic etch profile for a structure where a photoresist pattern is selectively formed over certain areas of a polysilicon layer over a silicon dioxide layer in turn on a bulk monocrystalline silicon substrate. Typically, the photoresist pattern is about 10,000 angstroms thick, the polysilicon layer is 2000 to 6000 angstroms thick and the silicon dioxide layer is about 250 angstroms thick. The chemical equations noted above suggest that removing the carbon source from the etch reaction will improve the selectivity of the etch.

We claim:

1. A process for forming an integrated circuit comprising:
    forming a dielectric layer overlying a substrate;
    depositing an electrode material over the dielectric layer;
    depositing a layer of photoresist over the electrode material;
    patterning the photoresist;
    exposing the photoresist to deep ultraviolet light
    baking the photoresist using a dehydration bake; and
    etching portions of the electrode material using a chemical system comprising inorganic components.

2. The process of claim 1 wherein the substrate is a semiconductor wafer, the electrode material is polycrystalline silicon and the dielectric layer is silicon dioxide.

3. The process of claim 1 in which the photoresist is positive photoresist.

4. The process of claim 1 in which the photoresist is negative photoresist.

5. The process of claim 1 in which the inorganic components used in the etch step are selected from the group consisting of nitrogen halides, sulfur halides, hydrogen halides, bimolecular halides and mixtures thereof.

6. The process of claim 5 in which the inorganic components used in the etch step are selected from the group consisting of helium, hydrogen chloride, hydrogen iodide, nitrogen trifluoride, sulfur hexafluoride, bimolecular chlorine and mixtures thereof.

7. The process of claim 1 in which the deep ultraviolet light exposure is conducted using a wavelength of 320 nanometers or less.

8. The process of claim 1 in which the dehydration bake step is conducted at a temperature of at least 125° C.

9. In the manufacture of an integrated circuit, a process for the selective plasma etch of polysilicon relative to silicon dioxide comprising:
    forming a silicon dioxide dielectric layer on the surface of a monocrystalline silicon wafer;
    forming a polysilicon gate material layer on the silicon dioxide layer;
    depositing a layer of photoresist over the polysilicon layer;
    exposing selected portions of the photoresist to ultraviolet light through a photomask;
    stripping off the exposed portions of the photoresist;
    exposing the remaining photoresist to deep ultraviolet light;
    baking the remaining photoresist in a dehydration bake step; and
    selectively plasma etching the portions of the polysilicon layer bared by the mask pattern using a chemical system comprising inorganic components selected from the group consisting of nitrogen halides, sulfur halides, hydrogen halides, bimolecular halides and mixtures thereof.

10. The process of claim 9 in which the inorganic components used in the plasma etch step are selected from the group consisting of helium, hydrogen chloride, hydrogen iodide, nitrogen trifluoride, sulfur hexafluoride, bimolecular chlorine and mixtures thereof.

11. The process of claim 9 in which the deep ultraviolet light exposure is conducted using a wavelength of 320 nanometers or less, and in which the dehydration bake step is conducted at a temperature of at least 125° C.

12. The process of claim 9 in which the photoresist contains no carbon.

13. In the manufacture of an integrated circuit, a process for the selective plasma etch of polysilicon relative to silicon dioxide comprising:
    forming a silicon dioxide dielectric layer on the surface of a monocrystalline silicon wafer;
    forming a polysilicon gate material layer on the silicon dioxide layer;

depositing a layer of photoresist over the polysilicon layer;

exposing selected portions of the photoresist to ultraviolet light through a photomask;

stripping off the exposed portions of the photoresist;

performing a photoresist carbon-binding pretreatment comprising:

subjecting the remaining exposed photoresist to a deep ultraviolet light treatment in which the ultraviolet light has a wavelength of 320 nanometers or less; and subjecting the remaining exposed photoresist to a dehydrogenation bake step having a temperature of at least 125° C.;

selectively plasma etching the portions of the polysilicon layer bared by the mask pattern using a chemical system comprising inorganic components are selected from the group consisting of helium, hydrogen chloride, hydrogen iodide, nitrogen trifluoride, sulfur hexafluoride, bimolecular chlorine and mixtures thereof, in which the ratio of etch rates of polysilicon to silicon dioxide is at least 100:1.

14. The process of claim 1, wherein the electrode material is a gate electrode material and the dielectric layer is a gate dielectric layer.

* * * * *